United States Patent
Bang et al.

(10) Patent No.: US 10,505,139 B2
(45) Date of Patent: Dec. 10, 2019

(54) ORGANIC LIGHT-EMITTING DISPLAY DEVICE

(71) Applicant: LG Display Co., Ltd., Seoul (KR)

(72) Inventors: Hyungseok Bang, Goyang-si (KR); JoongHwan Yang, Gwangmyeong-si (KR); JongGeun Yoon, Gunpo-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/790,568

(22) Filed: Oct. 23, 2017

(65) Prior Publication Data

US 2018/0123073 A1     May 3, 2018

(30) Foreign Application Priority Data

Oct. 31, 2016    (KR) ........................ 10-2016-0143991

(51) Int. Cl.
    *H01L 51/52*      (2006.01)
    *H01L 27/32*      (2006.01)
    *H01L 51/50*      (2006.01)

(52) U.S. Cl.
    CPC ........ *H01L 51/5203* (2013.01); *H01L 27/326* (2013.01); *H01L 27/3246* (2013.01); *H01L 51/5012* (2013.01); *H01L 51/5056* (2013.01); *H01L 51/5209* (2013.01); *H01L 51/5237* (2013.01); *H01L 51/5275* (2013.01); *H01L 2251/558* (2013.01)

(58) Field of Classification Search
None
See application file for complete search history.

(56) References Cited

U.S. PATENT DOCUMENTS

| | | | | |
|---|---|---|---|---|
| 2006/0175961 A1* | 8/2006 | Choong | .............. | H01L 51/5265 313/506 |
| 2012/0068171 A1* | 3/2012 | Yamana | .............. | H01L 51/5012 257/40 |
| 2015/0372066 A1* | 12/2015 | Choi | ................... | H01L 51/5218 257/40 |
| 2016/0372709 A1* | 12/2016 | Lee | ..................... | H01L 51/5268 |

\* cited by examiner

*Primary Examiner* — Nilufa Rahim
(74) *Attorney, Agent, or Firm* — Morgan, Lewis & Bockius LLP

(57) ABSTRACT

An organic light-emitting display device includes: a first substrate, a first electrode on the first substrate, a light-emitting layer on the first electrode, and a second electrode on the light-emitting layer, wherein an area in which the first electrode, the light-emitting layer, and the second electrode are sequentially stacked is defined as a pixel, and wherein the light-emitting layer includes a low refractive layer disposed in a first area in the pixel.

12 Claims, 10 Drawing Sheets

ORGANIC LIGHT-EMITTING DISPLAY DEVICE

CROSS-REFERENCE TO RELATED APPLICATIONS

This application claims the priority of Korean Application No. 10-2016-0143991, filed on Oct. 31, 2016, the entirety of which is hereby incorporated by reference.

BACKGROUND

1. Technical Field

The present disclosure relates to an organic light-emitting display device.

2. Discussion of the Related Art

With the advancement of an information-oriented society, various requirements for display devices for displaying an image are increasing. Therefore, various display devices, such as liquid crystal display (LCD) devices, plasma display panel (PDP) devices, organic light-emitting display devices, etc., are recently being used.

As a type of display device, organic light-emitting display devices are self-emitting display devices, and have better viewing angle and contrast ratio than LCD devices. Also, because the organic light-emitting display devices do not need a separate backlight, it is possible to lighten and thin the organic light-emitting display devices. Also, the organic light-emitting display devices are excellent in power consumption. Furthermore, the organic light-emitting display devices are driven with a low direct current (DC) voltage, have a fast response time, and are low in manufacturing cost.

The organic light-emitting display devices each include anode electrodes, a bank that divides the anode electrodes; a hole transporting layer, an organic light-emitting layer, and an electron transporting layer that are formed on the anode electrodes; and a cathode electrode formed on the electron transporting layer. In this case, when a high-level voltage is applied to the anode electrode and a low-level voltage is applied to the cathode electrode, a hole and an electron respectively move to the organic light-emitting layer through the hole transporting layer and the electron transporting layer, and are recombined with each other in the organic light-emitting layer to generate an exciton. Light having a particular wavelength is emitted according to an energy being emitted from the generated exciton.

However, in the organic light-emitting display devices, the organic light-emitting layer is deteriorated depending on a driving duration. As such, a lifetime of the organic light-emitting layer is short. Also, in the organic light-emitting display devices, internal quantum efficiency is low, and light emitted from the organic light-emitting layer can be lost due to total internal reflection (TIR), waveguide, and a surface plasmon resonance. Also, because a polarizer for preventing reflection of external light is attached on the organic light-emitting display devices, some of the light emitted from the organic light-emitting layer can be lost by the polarizer.

Therefore, an efficient method for increasing an output of light emitted from the organic light-emitting layer is needed. As an example of an efficient method, a method in which a micro-cavity structure is applied to an organic light-emitting device is known. The term "micro-cavity" denotes that light emitted from a light-emitting layer is amplified through repetitive reflection and re-reflection between an anode electrode and a cathode electrode to cause constructive interference, and thus, emission efficiency is enhanced. In detail, in a top emission type in which light is emitted in a direction toward the cathode electrode disposed on the anode electrode, if the anode electrode is formed as a reflective electrode and the cathode electrode is formed as a semi-transmissive electrode, an output of the light emitted from the organic light-emitting layer increases using the micro-cavity structure.

FIG. 1 is a diagram illustrating a micro-cavity structure using two parallel planes according to a related art.

Anode electrodes and a cathode electrode of an organic light-emitting display device are arranged on a plane, the micro-cavity structure applied to an organic light-emitting device may be considered as a cavity structure using two parallel planes PNL1 and PNL2 as in FIG. 1. In the cavity structure using the two parallel planes PNL1 and PNL2, an irradiation direction of light L may be changed as in FIG. 1. That is, a stability of the cavity structure using the two parallel planes PNL1 and PNL2 is low. Also, in the cavity structure using the two parallel planes PNL1 and PNL2, because a cavity length varies depending on the irradiation direction of the light L (as in FIG. 1), an output light spectrum is changed depending on a light irradiation direction.

SUMMARY

Accordingly, the present disclosure is directed to an organic light-emitting display device that substantially obviates one or more of the issues due to limitations and disadvantages of the related art.

An aspect is to provide an organic light-emitting display device for increasing cavity stability to enhance emission efficiency.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an organic light-emitting display device, including: a first substrate, a first electrode on the first substrate, a light-emitting layer on the first electrode, and a second electrode on the light-emitting layer, wherein an area in which the first electrode, the light-emitting layer, and the second electrode are sequentially stacked is defined as a pixel, and wherein the light-emitting layer includes a low refractive layer disposed in a first area in the pixel.

In another aspect, there is provided an organic light-emitting display device, including: a first substrate; a distributed Bragg reflector on the first substrate; a first electrode on the distributed Bragg reflector; a light-emitting layer on the first electrode; a second electrode on the light-emitting layer; and a low refractive layer between the distributed Bragg reflector and the first electrode.

In another aspect, there is provided an organic light-emitting display device, including: a first substrate; a first electrode on the first substrate; a light-emitting layer on the first electrode; and a second electrode on the light-emitting layer, wherein an area in which the first electrode, the light-emitting layer, and the second electrode are sequentially stacked is defined as a pixel, and wherein the first electrode comprises a first transparent electrode disposed in a second area in the pixel.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1:
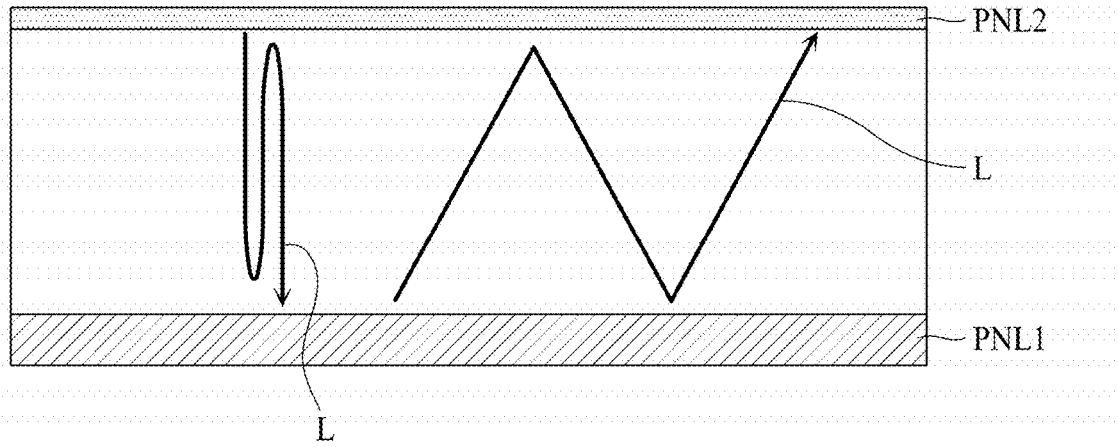
FIG. 1 is a diagram illustrating a micro-cavity structure using two parallel planes according to a related art.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to some embodiments of the present disclosure, examples of that may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

An x-axis direction, a y-axis direction, and a z-axis direction should not be construed as only a geometric relationship in which a relationship therebetween is vertical, and may denote having a broader directionality within a scope in which elements of the present disclosure operate functionally.

Figure 2:
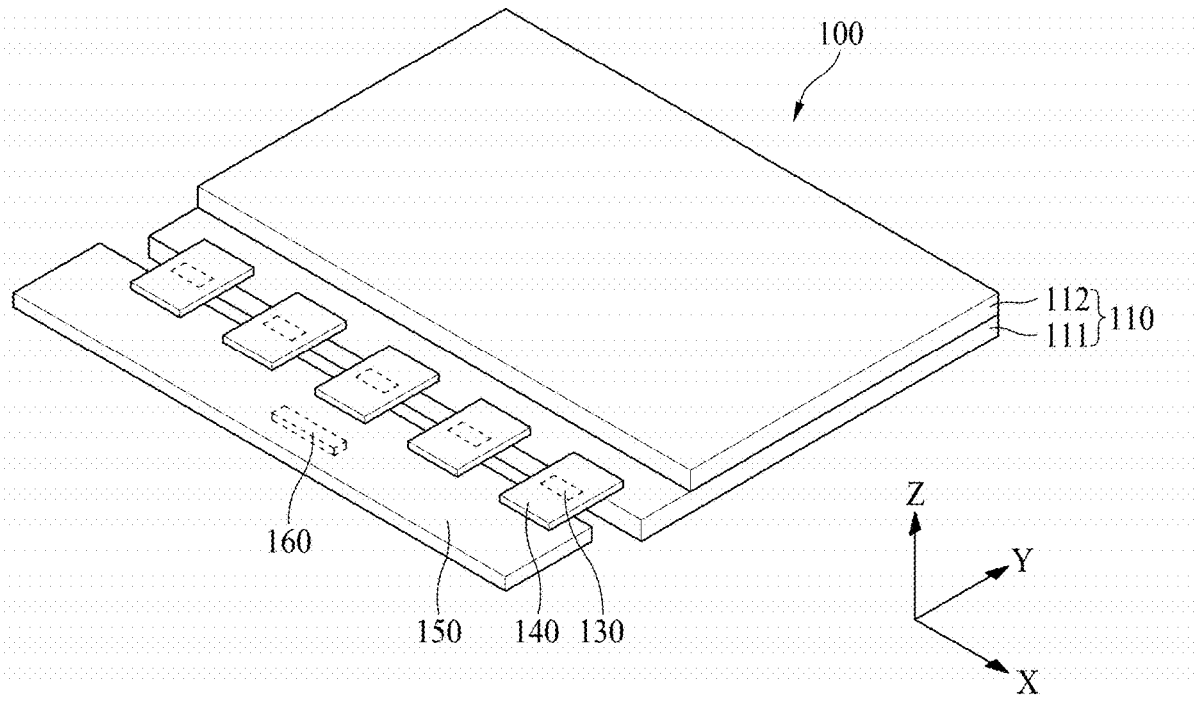
FIG. 2 is a perspective view illustrating an organic light-emitting display device according to an embodiment of the present disclosure.
Figure 3:
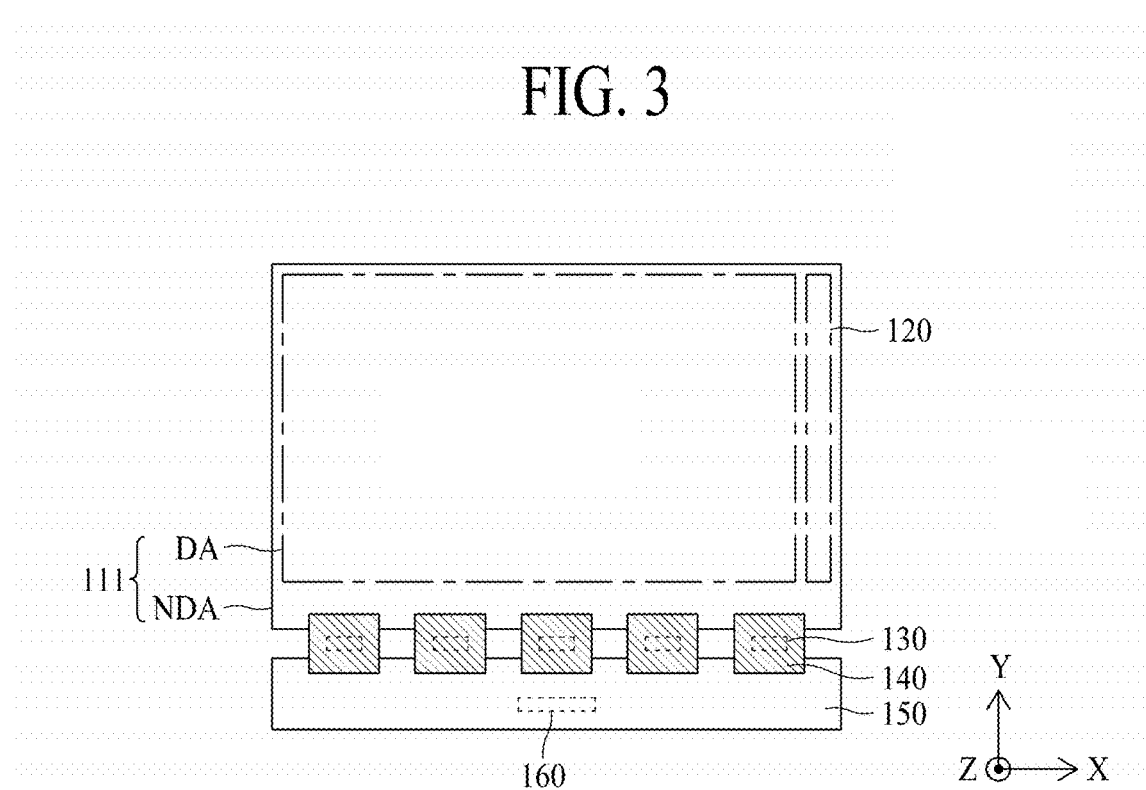
FIG. 3 is a diagram illustrating a first substrate, a gate driver, a source drive integrated circuit (IC), a flexible film, a circuit board, and a timing controller of the FIG. 2 device.

FIG. 2 is a perspective view illustrating an organic light-emitting display device according to an embodiment of the present disclosure. FIG. 3 is a diagram illustrating a first substrate, a gate driver, a source drive integrated circuit (IC), a flexible film, a circuit board, and a timing controller of the FIG. 2 device.

With reference to FIGS. 2 and 3, the organic light-emitting display device 100 according to an embodiment of the present disclosure may include a display panel 110, a gate driver 120, a source drive IC 130, a flexible film 140, a circuit board 150, and a timing controller 160. The display panel 110 may include a first substrate 111 and a second substrate 112. The second substrate 112 may be an encapsulation substrate. The first substrate 111 may be a plastic film, a glass substrate, or the like. The second substrate 112 may be a plastic film, a glass substrate, an encapsulation film, or the like.

A plurality of gate lines, a plurality of data lines, and a plurality of pixels may be provided on one surface of the first substrate 111 facing the second substrate 112. The pixels may be respectively provided in a plurality of areas defined by an intersection structure of the gate lines and the date lines.

Each of the pixels may include a thin film transistor (TFT) and an organic light-emitting device, which may include a first electrode, a light-emitting layer, and a second electrode. When a gate signal is input through a gate line, each of the pixels may supply a particular current to the organic light-emitting device using the TFT according to a data voltage supplied through a data line. Therefore, the organic light-emitting device of each of the pixels may emit light having a particular brightness according to the particular current. A structure of each of the pixels will be described below in detail with reference to FIGS. 3 to 13.

The display panel 110, as illustrated in the FIG. 3 example, may be divided into a display area DA, in which the pixels are provided to display an image, and a non-display area NDA, which may not display an image. The gate lines, the data lines, and the pixels may be provided in the display area DA. The gate driver 120 and a plurality of pads may be provided in the non-display area NDA.

The gate driver 120 may sequentially supply gate signals to the gate lines according to a gate control signal input from the timing controller 160. The gate driver 120 may be provided in the non-display area NDA outside one side or both sides of the display area DA of the display panel 110, foe example, in a gate-driver-in-panel (GIP) type. Alternatively, the gate driver 120 may be manufactured as a driving chip, and may be mounted on a flexible film, and moreover, may be attached on the non-display area NDA outside the one side or the both sides of the display area DA of the display panel 110 in a tape automated bonding (TAB) type.

The source drive IC 130 may receive digital video data and a source control signal from the timing controller 160. The source driver IC 130 may convert the digital video data into analog data voltages according to the source control signal, and may respectively supply the analog data voltages to the data lines. If the source drive IC 130 is manufactured as a driving chip, the source drive IC 130 may be mounted on the flexible film 140, for example, in a chip-on-film (COF) type or a chip-on-plastic (COP) type.

A plurality of pads, such as data pads, may be provided in the non-display area NDA of the display panel 110. Lines connecting the pads to the source drive IC 130 and lines connecting the pads to lines of the circuit board 150 may be provided on the flexible film 140. The flexible film 140 may be attached on the pads, for example, using an anisotropic conductive film. Thus, the pads may be connected to the lines of the flexible film 140.

The circuit board 150 may be attached on the flexible film 140, which may be provided in plurality. A plurality of circuits implemented as driving chips may be mounted on the circuit board 150. For example, the timing controller 160 may be mounted on the circuit board 150. The circuit board 150 may be, for example, a printed circuit board (PCB) or a flexible printed circuit board (FPCB).

The timing controller 160 may receive the digital video data and a timing signal from an external system board (not shown), e.g., through a cable of the circuit board 150. The timing controller 160 may generate a gate control signal for controlling an operation timing of the gate driver 120 and a source control signal for controlling the source drive IC 130, which may be provided in plurality, based on the timing signal. The timing controller 160 may supply the gate control signal to the gate driver 120, and may supply the source control signal to the plurality of source drive ICs 130.

Figure 4:
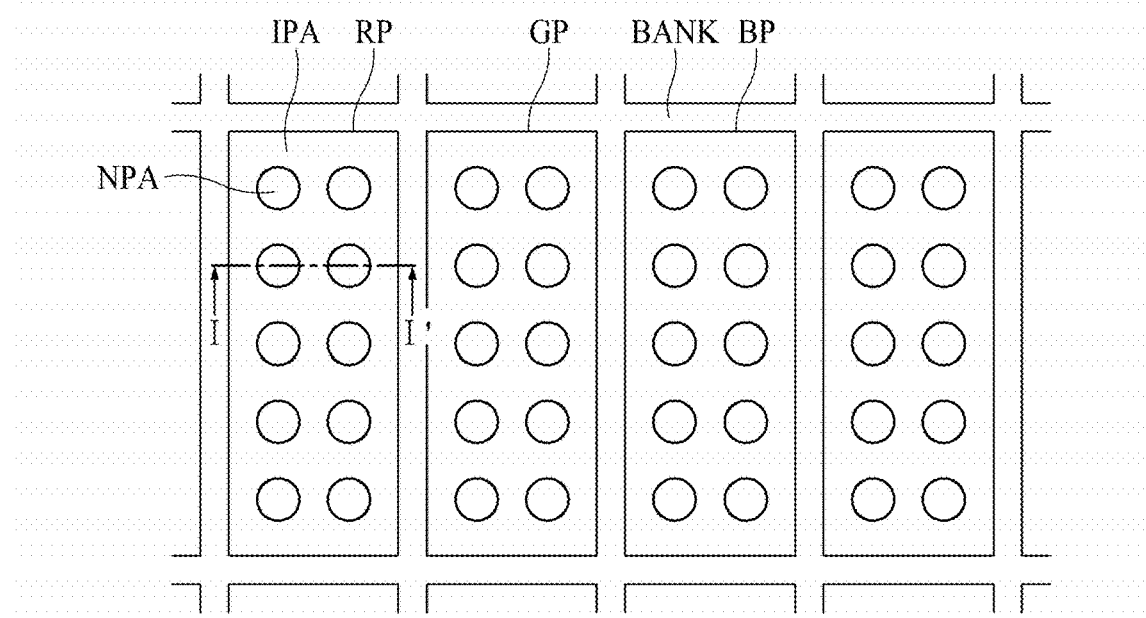
FIG. 4 is a plan view illustrating pixels in a display area according to an embodiment of the present disclosure.

FIG. 4 is a plan view illustrating pixels in a display area according to an embodiment of the present disclosure.

In the FIG. 4 example, for convenience of description, only a red pixel RP, a green pixel GP, a blue pixel BP, a bank BANK, a first area IPA, and a second area NPA are illustrated. With reference to FIG. 4, each of the red pixel RP, the green pixel GP, the blue pixel BP may denote an area in which a first electrode corresponding to an anode electrode, a light-emitting layer, and a second electrode corresponding to a cathode electrode may be sequentially stacked. The red pixel RP, the green pixel GP, and the blue pixel BP may be defined as one unit pixel. However, embodiments are not limited thereto. For example, a white subpixel may be additionally provided. In this case, a red subpixel, a green subpixel, a blue subpixel, and a white subpixel may be defined as one unit pixel.

The red pixel RP, the green pixel GP, and the blue pixel BP may be defined by the bank BANK. That is, the bank BANK may act as a pixel defining layer.

The red pixel RP, the green pixel GP, and the blue pixel BP may each include the first and second areas IPA and NPA as in the example of FIG. 4. The first area IPA may correspond to an area in which a low refractive layer may be provided. The second area NPA may be defined by the first area IPA, and may correspond to an area in which a low refractive layer is not provided. Also, the first area IPA may surround the second area NPA.

In the FIG. 4 example, it is illustrated that the second area NPA is circular in planar shape, but embodiments are not limited thereto. For example, the second area NPA may be polygonal or elliptical in planar shape.

Also, in the example of FIG. 4, it is illustrated that the red pixel RP, the green pixel GP, and the blue pixel BP may each include the first areas IPA and the second areas NPA, but embodiments are not limited thereto. For example, the red pixel RP, the green pixel GP, and the blue pixel BP may each include only one first area IPA and the second area NPA.

Figure 5:
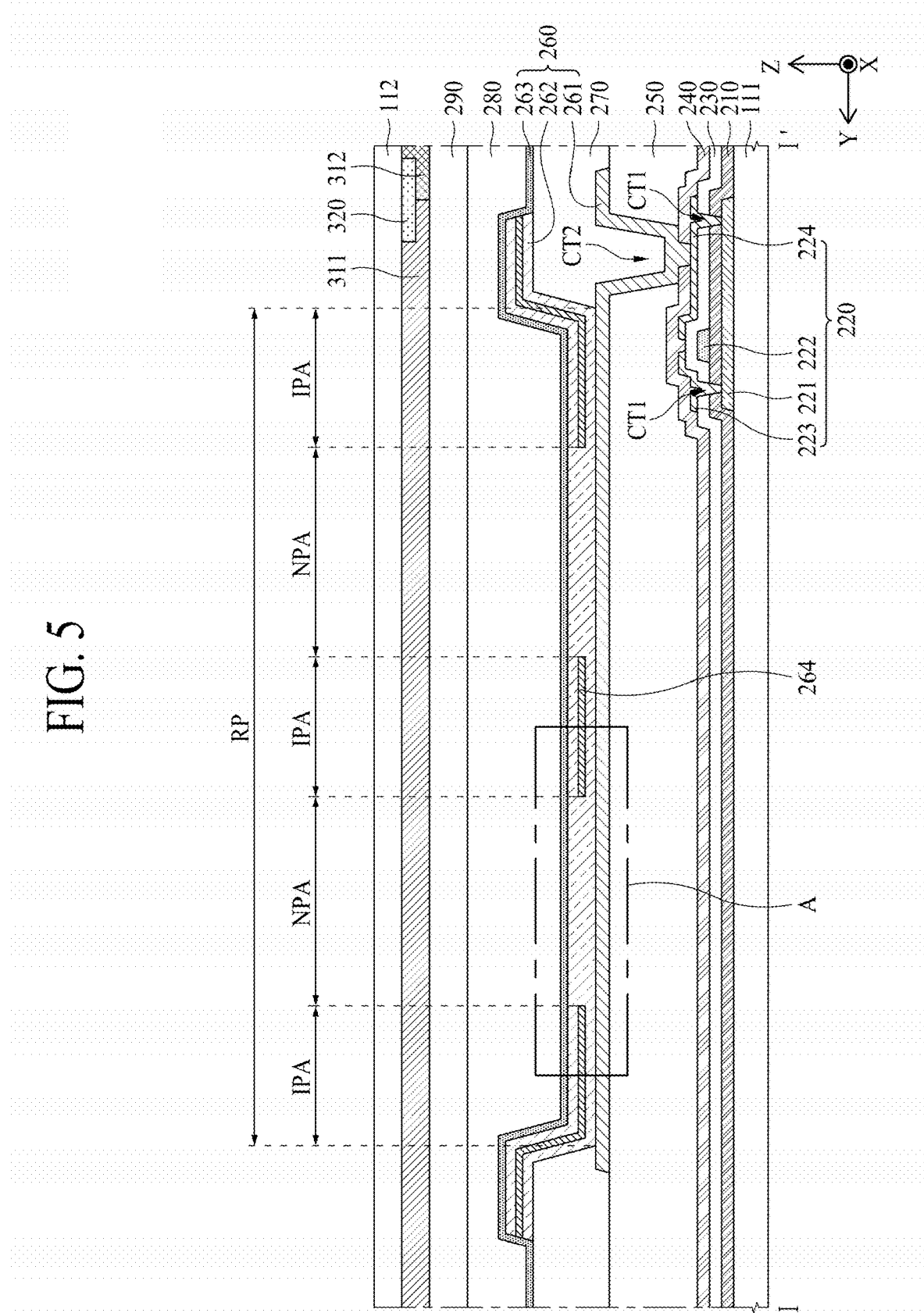
FIG. 5 is a cross-sectional view illustrating an example taken along line I-I' of FIG. 4.

FIG. 5 is a cross-sectional view illustrating an example taken along line I-I' of FIG. 4.

With reference to FIG. 5, the first and second substrates 111 and 112 may each be glass, plastic, or the like. A buffer layer may be formed on one surface of the first substrate 111 facing the second substrate 112. The buffer layer may be formed on the one surface of the first substrate 111, e.g., for protecting a plurality of TFTs 220 and a plurality of organic light-emitting devices 260 from water that may penetrate through the first substrate 111 that may be vulnerable to penetration of water. The buffer layer may include a plurality of inorganic layers that may be alternately stacked. For example, the buffer layer may be formed of a multilayer in which one or more inorganic layers, e.g., of silicon oxide ($SiO_x$), silicon nitride ($SiN_x$), and SiON may be alternately stacked. However, the buffer layer may be omitted.

The TFTs 220 may be formed on the buffer layer or on the first substrate 111 if the buffer layer is omitted. Each of the TFTs 220 may include an active layer 221, a gate electrode 222, a source electrode 223, and a drain electrode 224. In the FIG. 5 example, the TFTs 220 are illustrated as being formed in a top-gate type in which the gate electrode 222 is disposed on the active layer 221, but embodiments are not limited thereto. For example, the TFTs 220 may be formed in a bottom-gate type in which the gate electrode 222 is disposed under the active layer 221, or in a double-gate type in which the gate electrode 222 is disposed both on and under the active layer 221.

The active layer 221 may be formed on the buffer layer or on the first substrate 111 if the buffer layer is omitted. The active layer 221 may be formed, for example, of a silicon-based semiconductor material or an oxide-based semiconductor material. A light-blocking layer for blocking external light incident on the active layer 221 may be formed between the buffer layer and the active layer 221.

A gate insulation layer 210 may be formed on the active layer 221. The gate insulation layer 210 may be formed of an inorganic layer, for example, silicon oxide ($SiO_x$), silicon nitride ($SiN_x$), or a multilayer thereof The gate electrode 222 and a gate line may be formed on the gate insulation layer 210. The gate electrode 222 and the gate line may each be formed of a single layer or a multilayer, and may include one or more of: molybdenum (Mo), aluminum (Al), chromium (Cr), gold (Au), titanium (Ti), nickel (Ni), neodymium (Nd), and copper (Cu), or an alloy of any thereof.

An interlayer dielectric 230 may be formed on the gate electrode 222 and the gate line. The interlayer dielectric 230 may be formed of an inorganic layer, for example, $SiO_x$, $SiN_x$, or a multilayer thereof.

The source electrode 223, the drain electrode 224, and a data line may be formed on the interlayer dielectric 230. The source electrode 223 may contact the active layer 221 through a contact hole CT1, which may pass through the gate insulation layer 210 and the interlayer dielectric 230. The drain electrode 224 may contact the active layer 221 through another contact hole CT1, which may pass through the gate insulation layer 210 and the interlayer dielectric 230. The source electrode 223, the drain electrode 224, and the data line may each be formed of a single layer or a multilayer, and may include one or more of: Mo, Al, Cr, Au, Ti, Ni, Nd, Cu, or an alloy of any thereof.

A passivation layer 240 for insulating the TFTs 220 may be formed on the source electrode 223, the drain electrode 224, and the data line. The passivation layer 240 may be formed of an inorganic layer, for example, $SiO_x$, $SiN_x$, or a multilayer thereof.

A planarization layer 250 for planarizing a step height caused by the TFTs 220 may be formed on the passivation layer 240. The planarization layer 250 may be formed of an organic layer, such as acryl resin, epoxy resin, phenolic resin, polyamide resin, polyimide resin, and/or the like.

An organic light-emitting device 260 and a bank 270 may be formed on the planarization layer 250. The organic light-emitting device 260 may include a first electrode 261, a light-emitting layer 262, and a second electrode 263. The first electrode 261 may be an anode electrode, and the second electrode 263 may be a cathode electrode. The organic light-emitting display device according to an embodiment of the present disclosure may be implemented in a top-emission type in which light of the light-emitting layer 262 of the organic light-emitting device 260 may be irradiated in a direction toward the second substrate 112.

The first electrode 261 may be formed on the planarization layer 250. The first electrode 261 may be connected to the source electrode 223 of the TFT 220 through a contact hole CT2, which may pass through the passivation layer 240 and the planarization layer 250.

The bank 270 may be formed on the planarization layer 250 to cover an edge of the first electrode 261, which may be provided in plurality, e.g., for dividing the pixels RP, GP, and BP. That is, the bank 270 may define the pixels RP, GP, and BP. Also, an area in which the bank 270 is provided may not emit light, and thus, may correspond to a non-emissive area. The bank 270 may be formed, for example, of an organic layer, such as acryl resin, epoxy resin, phenolic resin, polyamide resin, polyimide resin, and/or the like.

The light-emitting layer 262 may be formed on the first electrode 261 and the bank 270. When a high-level voltage is applied to the first electrode 261 and a low-level voltage is applied to the second electrode 263, a hole and an electron may respectively move to the organic light-emitting layer through the hole transporting layer and the electron transporting layer, and may be recombined with each other in the organic light-emitting layer to generate an exciton. Light having a particular wavelength may be emitted according to energy being emitted from the generated exciton. Accordingly, the light-emitting layer 262 may emit the light.

In the FIG. 5 example, only a red light-emitting layer 262 provided in the red pixel RP is illustrated for convenience. That is, the red light-emitting layer 262 emitting red light may be provided in the red pixel RP, a green light-emitting layer emitting green light may be provided in the green pixel GP, and a blue light-emitting layer emitting blue light may be provided in the blue pixel BP. The red, green, and blue light-emitting layers may each include a hole transporting layer, an organic light-emitting layer, and an electron transporting layer.

Alternatively, the light-emitting layer 262 may be a common layer that may be formed in the pixels RP, GP, and BP in common, and may be a white light-emitting layer that may emit white light. In one example, the light-emitting layer 262 may be formed in a tandem structure of two or more stacks. Each of the stacks may include a hole transporting layer, at least one organic light-emitting layer, and an electron transporting layer.

Figure 6:
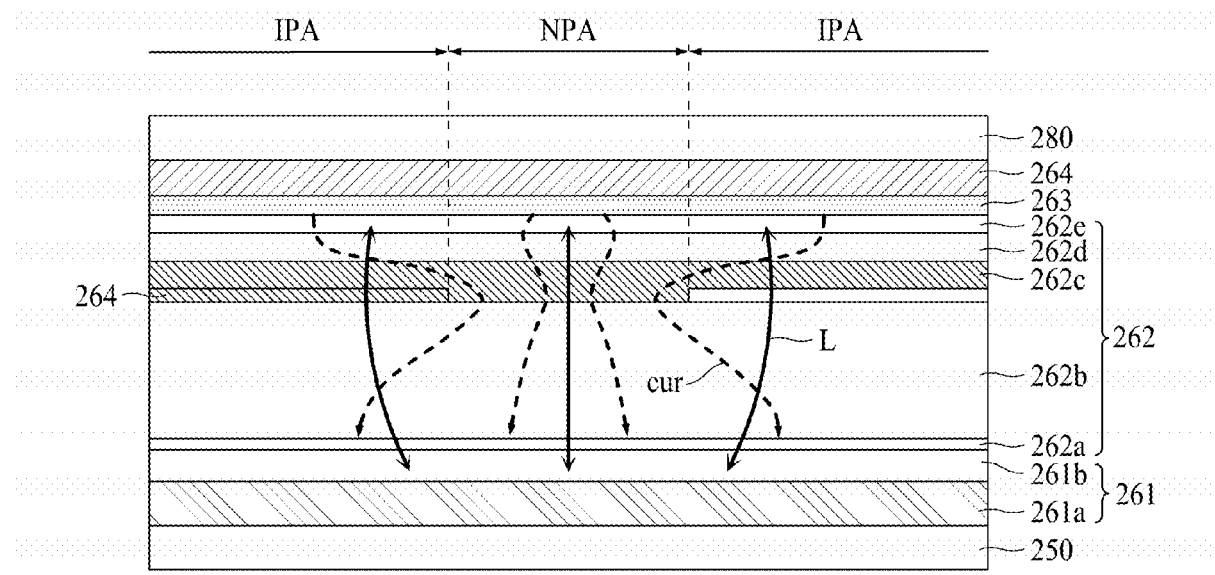
FIG. 6 is an enlarged view illustrating an example of area A of FIG. 5.

FIG. 6 is an enlarged view illustrating an example of area A of FIG. 5.

The light-emitting layer 262 may include a first low refractive layer 264 provided in the first area IPA. A refractive index of the first low refractive layer 264 may be lower than that of each of the hole transporting layer, the organic light-emitting layer, and the electron transporting layer of the light-emitting layer 262. In one example, if the first low refractive layer 264 is disposed between a hole transporting layer 262b and an organic light-emitting layer 262c, light traveling from each of the hole transporting layer 262b, the organic light-emitting layer 262c, and an electron transporting layer 262d to the first low refractive layer 264 may be refracted due to a refractive index difference between the first low refractive layer 264 and each of the hole transporting layer 262b, the organic light-emitting layer 262c, and the electron transporting layer 262d as in the FIG. 6 example. That is, the first low refractive layer 264 may act as a convex lens in the FIG. 6 example, and thus, may allow light to concentrate on the second area NPA. Also, although the first electrode 261 and the second electrode 263 may be planarly provided, light may stably resonate in the second area NPA due to the first low refractive layer 264. The first low refractive layer 264 may be formed, for example, of acryl copolymer, siloxane polymer, polyimide, and/or the like.

Moreover, when the first low refractive layer 264 of the light-emitting layer 262 is formed as an insulation layer, a current flowing between the first electrode 261 and the second electrode 263 may be blocked. Therefore, the current flowing between the first electrode 261 and the second electrode 263 may primarily flow to the second area NPA in which the first low refractive layer 264 may not be provided. That is, holes and electrons may be recombined in the organic light-emitting layer in the second area NPA to generate excitons. Thus, a distribution of the excitons may be increased or maximized in the second area NPA.

As described above, in an example embodiment of the present disclosure, light may concentrate on the second area NPA. Moreover, the distribution of the excitons is may be increased or in the second area NPA. The concentration and/or distribution may increase an emission efficiency of the organic light-emitting device 260. The light-emitting layer 262 and the first low refractive layer 264 will be described in further detail below with reference to the examples of FIGS. 6 and 7.

The second electrode 263 may be formed on the light-emitting layer 262. The second electrode 263 may be a common layer that may be formed in the pixels RP, GP, and BP in common. The second electrode 263 may be formed of a transparent conductive material (TCO), such as indium tin oxide (ITO) or indium zinc oxide (IZO), capable of transmitting light, or may be a semi-transmissive conductive material, such as magnesium (Mg) or an alloy of Mg and silver (Ag). To obtain a micro-cavity effect, the second electrode 263 may be formed of a semi-transmissive conductive material. The term "micro-cavity" denotes that light emitted from the light-emitting layer 262 is amplified through repetitive reflection and re-reflection between the first and second electrodes 261 and 263 to cause constructive interference. Thus, emission efficiency may be enhanced. A capping layer may be formed on the second electrode 263.

An encapsulation layer 280 may be formed on the second electrode 263. The encapsulation layer 280 may reduce or prevent oxygen or water from penetrating into the light-emitting layer 262 and the second electrode 263. As such, the encapsulation layer 280 may include at least one inorganic layer and at least one organic layer.

A plurality of color filters 311 and 312 and a black matrix 320 may be disposed on the encapsulation layer 280. The color filters 311 and 312 may be disposed in an area corresponding to the pixels RP, GP, and BP. A red color filter 311 may be disposed in correspondence with the red pixel RP, a green color filter 312 may be disposed in correspondence with the green pixel GP, and a blue color filter may be disposed in correspondence with the blue pixel BP. The red color filter may be formed, for example, of an organic layer including a red pigment. The green color filter may be formed, for example, of an organic layer including a green pigment. The blue color filter may be formed, for example, of an organic layer including a blue pigment. If the red, green, and blue light-emitting layers 262 are respectively disposed in correspondence with the red, green, and blue pixels RP, GP, and BP as in the FIG. 5 example, the color filters 311 and 312 may be omitted.

The black matrix 320 may be disposed between the color filters 311 and 312. The black matrix 320 may be provided in a non-emissive area instead of in an emissive area (EA), and thus, may overlap the bank 270. The black matrix 320 may be formed, for example, of an organic layer, which may include a black pigment.

The encapsulation layer 280 of the first substrate 111 may be adhered to the color filters 311 and 312 of the second substrate 112, e.g., using an adhesive layer 290. Thus, the first substrate 111 may be bonded to the second substrate 112. The adhesive layer 290 may be a transparent adhesive resin.

With further reference to FIG. 6, the organic light-emitting display device according to an embodiment of the present disclosure may be implemented in the top-emission type in which light of the light-emitting layer 262 of the organic light-emitting device 260 may be irradiated in a direction toward the second substrate 112. Thus, the first electrode 261 may include a reflective electrode 261a. The reflective electrode 261a may be formed of a metal material, which is high in reflectivity, such as Al, Ag, an Al alloy, an Ag alloy, or an APC alloy. A transparent electrode 261b may be formed on the reflective electrode 261, and may be formed of a transparent conductive material (TCO), such as ITO or IZO capable of transmitting light.

The light-emitting layer 262 may include a hole injecting layer 262a, a hole transporting layer 262b, an organic light-emitting layer 262c, an electron transporting layer 262d, and an electron injecting layer 262e. The hole injecting layer 262a may be disposed on the first electrode 261, and may smoothly inject a hole of the first electrode 261 into the organic light-emitting layer 262c. The hole injecting layer 262a may be formed, for example, of one or more of: copper phthalocyanine (CuPc), poly(3,4)-ethylenedioxythiophene (PEDOT), polyaniline (PANT), or N,N-dinaphthyl-N,N'-diphenyl benzidine (NPD), but embodiments of the present disclosure are not limited thereto. In addition, the hole injecting layer 262a may be omitted.

The hole transporting layer 262b may smoothly transfer the hole, injected from the first electrode 261, to the organic light-emitting layer 262c. Also, the hole transporting layer 262b may have a thickness for optimizing a micro-cavity distance between the first electrode 261 and the second electrode 263. The hole transporting layer 262b may be formed, e.g., of one or more of: N,N-dinaphthyl-N,N'-diphenyl benzidine (NPD), N,N'-bis-(3-methylphenyl)-N,N'-bis-(phenyl)-benzidine (TPD), 4-(9H-carbazol-9-yl)-N,N-bis[4-(9H-carbazol-9-yl)phenyl]-benzenamine (TCTA), 4,4'-N,N'-dicarbazole-biphenyl (CBP), s-TAD, 4,4',4"-Tris (N-3-methylphenyl-N-phenyl-amino)-triphenylamine (MT-DATA), but embodiments of the present disclosure are not limited thereto.

The organic light-emitting layer 262c may include a host and a dopant. Also, the organic light-emitting layer 262c may include a material emitting, e.g., red light, green light, blue light, or white light, and may be formed of a fluorescent material or a phosphorescent material.

If the organic light-emitting layer 262c is an organic light-emitting layer emitting red light, the organic light-emitting layer 262c may include a phosphorescent material including a host material and one or more dopants selected from among: bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), and octaethylporphyrin platinum (PtOEP). Examples of the host material may include carbazole biphenyl (CBP), 1,3-bis(carbazol-9-yl (mCP), and/or the like. On the other hand, the organic light-emitting layer 262c may include a fluorescent material including, for example, PBD: Eu(DBM)3(Phen), Perylene, and/or the like. However, embodiments are not limited to the above examples.

If the organic light-emitting layer 262c is an organic light-emitting layer emitting green light, the organic light-emitting layer 262c may include a phosphorescent material, which may include a host material and a dopant material. Examples of the host material may include CBP, mCP, etc. Examples of the dopant material may include fac tris(2-phenylpyridine)iridium (Ir(ppy)3), etc. On the other hand, the organic light-emitting layer 262c may include a fluorescent material including tris(8-hydroxyquinolino)aluminum (Alq3) and/or the like. However, embodiments are not limited to these examples.

If the organic light-emitting layer 262c is an organic light-emitting layer emitting blue light, the organic light-emitting layer 262c may include a phosphorescent material, which may include a host material and a dopant material. Examples of the host material may include CBP, mCP, etc. Examples of the dopant material may include (4,6-F2ppy) 2Irpic, L2BD111, etc. However, embodiments are not limited to these examples.

The electron transporting layer 262d may be disposed on the organic light-emitting layer 262c, and may smoothly transfer an electron, injected from the second electrode 263, to the organic light-emitting layer 262c. The electron transporting layer 262d may be formed, for example, of one or more of: 2-(4-biphenyl)-5-(4-tert-butylphenyl)-1,3,4-oxadiazole (PBD), 3-(4-biphenyl)-4-phenyl-5-tertbutylphenyl-1, 2,4-triazole (TAZ), 8-hydroxyquinolinolato-lithium (Liq), Bis(2-methyl-8-quinolinolate)-4-(phenylphenolato)aluminium (BAlq), 2,2',2'-(1,3,5-benzinetriyl)-tris(1-phenyl-1-H-benzimidazole (TPBi), and/or the like. However, embodiments are not limited thereto.

The electron injecting layer 262e may be disposed on the electron transporting layer 262d, and may smoothly transfer the electron of the second electrode 263 to the organic light-emitting layer 262c. However, the electron injecting layer 262e may be omitted.

The light-emitting layer 262 may further include the first low refractive layer 264 disposed in the first area IPA. A refractive index of the first low refractive layer 264 may be lower than that of each of the hole injecting layer 262a, the hole transporting layer 262b, the organic light-emitting layer 262c, the electron transporting layer 262d, and the electron injecting layer 262e of the light-emitting layer 262. As in the FIG. 6 example, if the first low refractive layer 264 is disposed between the hole transporting layer 262b and the organic light-emitting layer 262c, light L traveling from each of the hole transporting layer 262b, the organic light-emitting layer 262c, and the electron transporting layer 262d to the first low refractive layer 264 may be refracted due to a refractive index difference between the first low refractive layer 264 and each of the hole transporting layer 262b, the organic light-emitting layer 262c, and the electron transporting layer 262d as in the example of FIG. 6. That is, the first low refractive layer 264 may act as the convex lens of the FIG. 6 example, and thus, may allow light to concentrate on the second area NPA. Also, although the first electrode 261 and the second electrode 263 may be planarly provided, the light L may stably resonate in the second area NPA due to the first low refractive layer 264. The first low refractive layer 264 may be formed, for example, of acryl copolymer, siloxane polymer, polyimide, and/or the like.

Moreover, when the first low refractive layer 264 is formed as an insulation layer, a current flowing between the first electrode 261 and the second electrode 263 may be blocked. Therefore, the current flowing between the first electrode 261 and the second electrode 263 may primarily flow to the second area NPA in which the first low refractive layer 264 may not be provided. That is, holes and electrons may be recombined in the organic light-emitting layer in the second area NPA to generate excitons. Thus, a distribution of the excitons may be increased or maximized in the second area NPA. As described above, in an example embodiment of the present disclosure, light may concentrate on the second area NPA, and moreover, the distribution of the excitons may be increased or maximized in the second area NPA, thereby increasing an emission efficiency of the organic light-emitting device 260.

The first low refractive layer 264 may be formed at an arbitrary position between the first electrode 261 and the second electrode 262. In the FIG. 6, the first low refractive layer 264 is illustrated as being disposed between the hole transporting layer 262b and the organic light-emitting layer 262c, but embodiments are not limited thereto. For example, the first low refractive layer 264 may be disposed between the organic light-emitting layer 262c and the electron transporting layer 262d, between the electron transporting layer 262d and the electron injecting layer 262e, between the electron injecting layer 262e and the second electrode 263, between the hole injecting layer 262a and the hole transporting layer 262b, or between the first electrode 261 and the hole injecting layer 262a. However, in an example embodiment of the present disclosure, to realize a structure in which light may concentrate on the second area NPA and a distribution of excitons may be increased or maximized, the first low refractive layer 264 may be disposed adjacent to the organic light-emitting layer 262c.

Moreover, to increase an effect in which light is refracted like a convex lens, an edge of the first low refractive layer 264 may be provided to have a particular slope. For example, the edge of the first low refractive layer 264 may be provided in a taper structure as in the FIG. 6 example. In FIG. 6, the edge of the first low refractive layer 264 is illustrated as being provided in the taper structure, but embodiments are not limited thereto. For example, the edge of the first low refractive layer 264 may be provided in a reverse taper structure. The term "taper structure" may denote a structure in which an angle between a bottom and a side is 0° (degrees) to 90° (degrees). The term "reverse taper structure" may denote a structure in which the angle between the bottom and the side is 90° (degrees) to 180° (degrees).

The second electrode 263 may be formed on the light-emitting layer 262. The second electrode 263 may be a common layer that may be formed in the pixels RP, GP, and BP in common. The second electrode 263 may be formed of a transparent conductive material (TCO), such as ITO or IZO capable of transmitting light, or may be a semi-transmissive conductive material, such as Mg or an alloy of Mg and Ag. To obtain a micro-cavity effect, the second electrode 263 may be formed of a semi-transmissive conductive material.

A capping layer 265 may be formed on the second electrode 263. The capping layer 265 may increase a light extraction effect, and may be formed of one or more materials selected from among: a material of the hole transporting layer 262b, a material of the electron transporting layer 262d, and a host material of the organic light-emitting layer 262c, but embodiments are not limited thereto.

Figure 7:
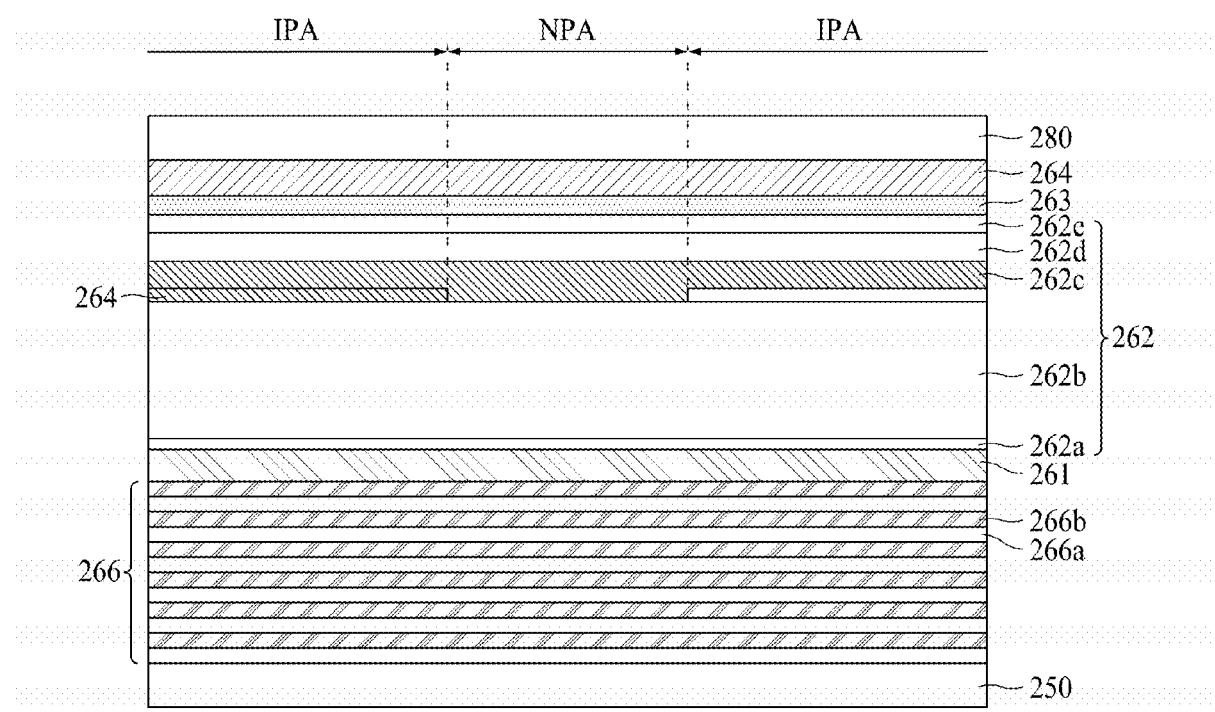
FIG. 7 is an enlarged view illustrating another example of area A of FIG. 5.

FIG. 7 is an enlarged view illustrating another example of area A of FIG. 5.

Except for a first electrode 261 being formed of a transparent electrode, and a distributed Bragg reflector being provided under the first electrode 261, an example embodiment illustrated in FIG. 7 is substantially similar to the example embodiment described above with reference to FIG. 6. Thus, detailed descriptions of a light-emitting layer 262, a second electrode 263, a first low refractive layer 264, and a capping layer 265 of FIG. 7 are omitted for convenience.

With reference to the FIG. 7 example, the first electrode 261 may be formed of a transparent electrode for transferring light, reflected from the distributed Bragg reflector 266, to the light-emitting layer 262. For example, the first electrode 261 may be formed of a transparent conductive material (TCO), such as ITO or IZO, capable of transmitting light.

The distributed Bragg reflector 266 may be formed by alternately stacking a plurality of inorganic layers having different refractive indexes. The term "distributed Bragg reflector" may denote a reflective structure in which constructive interference is performed on lights reflected from boundary surfaces between the inorganic layers having different refractive indexes to reflect light having a particular wavelength. For example, as in the example of FIG. 7, the distributed Bragg reflector 266 may have a structure in which a first inorganic layer 266a and a second inorganic layer 266b, having a refractive index lower than that of the first inorganic layer 266a, may be alternately stacked. For example, the first inorganic layer 266a may be $SiO_x$, and the second inorganic layer 266b may be $SiN_x$. However, embodiments are not limited thereto.

Figure 8:
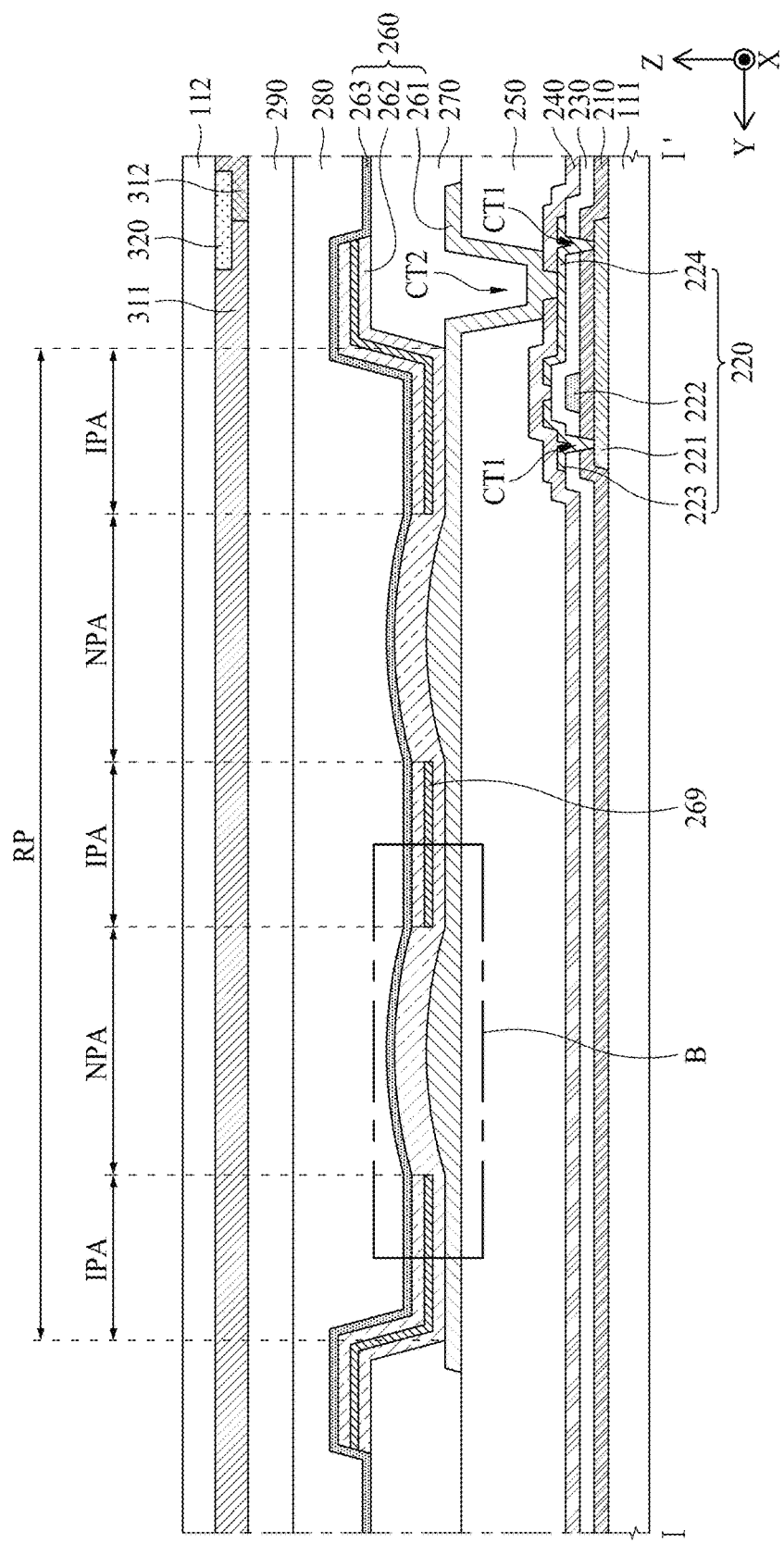
FIG. 8 is a cross-sectional view illustrating another example taken along line I-I' of FIG. 4.

FIG. 8 is a cross-sectional view illustrating another example taken along line I-I' of FIG. 4.

Except for a first electrode 261 being provided in a convex lens form in each of second areas NPA, and a first insulation layer 269 being provided instead of a first low refractive layer 264, an example embodiment illustrated in FIG. 8 is substantially similar to the example embodiment described above with reference to FIG. 5. Thus, detailed descriptions of a first substrate 111, a second substrate 112, a gate insulation layer 210, a transistor 220, an interlayer dielectric 230, a passivation layer 240, a planarization layer 250, a light-emitting layer 262, a second electrode 263, a bank 270, an encapsulation layer 280, an adhesive layer 290, color filters 311 and 312, and a black matrix 320 of FIG. 8 are omitted for convenience. The first electrode 261, provided in the convex lens form in each of the second areas NPA, will be described below in detail with reference to FIGS. 9 to 11.

Figure 9:
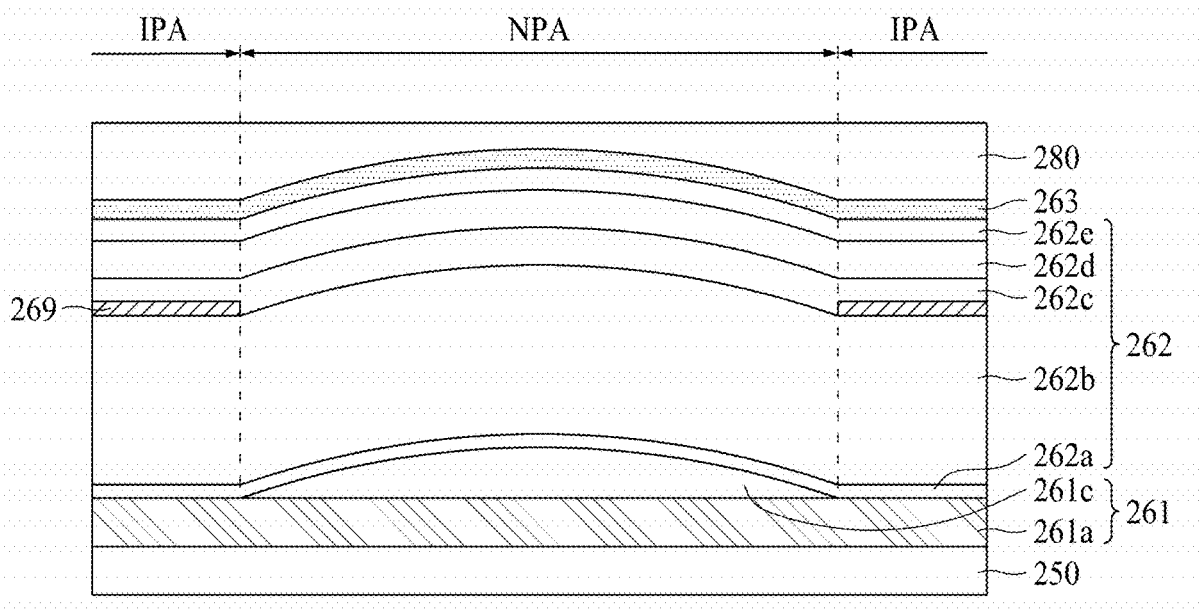
FIG. 9 is an enlarged view illustrating an example of area B of FIG. 8.

FIG. 9 is an enlarged view illustrating an example of area B of FIG. 8.

Except for a first electrode 261 including a reflective electrode 261a, a transparent electrode 261c having a convex lens form, and a first insulation layer 269 being provided instead of a first low refractive layer 264, an example embodiment illustrated in FIG. 9 is substantially similar to the example embodiment described above with reference to FIG. 6. Thus, detailed descriptions of a light-emitting layer 262 and a second electrode 263 of FIG. 9 are omitted for convenience.

With reference to the FIG. 9 example, an organic light-emitting display device according to an embodiment of the present disclosure may be implemented in a top-emission type in which light of the light-emitting layer 262 of an organic light-emitting device 260 may be irradiated in a direction toward the second substrate 112. Thus, the first electrode 261 may include a reflective electrode 261a. The reflective electrode 261a may be formed of a metal material, which is high in reflectivity, such as Al, Ag, an Al alloy, an Ag alloy, or an APC alloy. The reflective electrode 261a may be provided in a whole portion of each of pixels RP, GP, and BP. The transparent electrode 261c having a convex lens form may be provided on the reflective electrode 261a, and may be formed of a transparent conductive material (TCO), such as ITO or IZO, capable of transmitting light. The transparent electrode 261c having a convex lens form may be provided in each of the second areas NPA of each of the pixels RP, GP, and BP.

Moreover, the transparent electrode 261c of the first electrode 261 may be provided in the convex lens form in each of the second areas NPA. Thus, a hole injecting layer 262a, a hole transporting layer 262b, an organic light-emitting layer 262c, an electron transporting layer 262d, an electron injecting layer 262e, and a second electrode 263 may be convexly provided in each of the second areas NPA.

Figure 10:
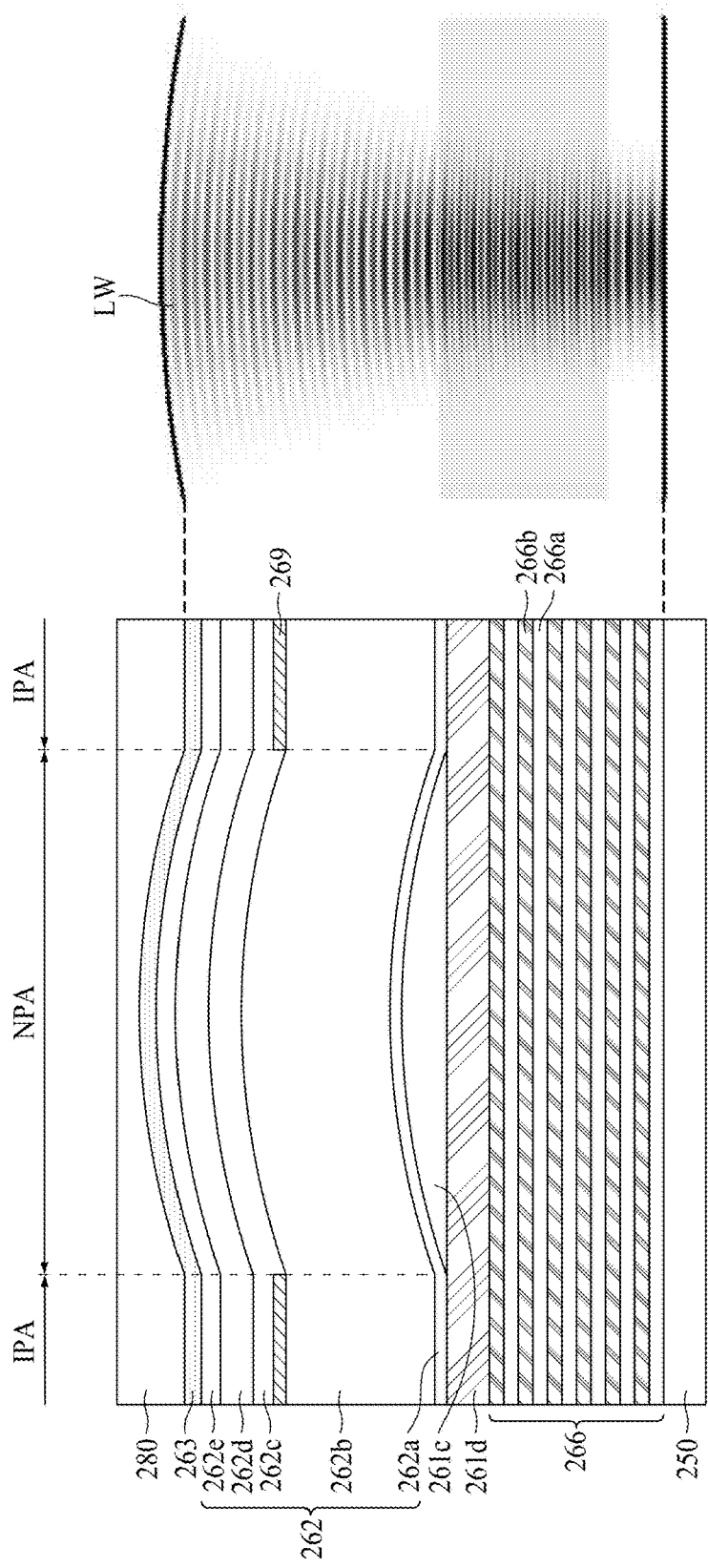
FIG. 10 is an enlarged view illustrating another example of area B of FIG. 8.

A refractive index of the transparent electrode 261c having the convex lens form may be higher than that of each of the hole injecting layer 262a, the hole transporting layer 262b, the organic light-emitting layer 262c, the electron transporting layer 262d, and the electron injecting layer 262e of the light-emitting layer 262. Therefore, light in the transparent electrode 261c having the convex lens form may travel faster than light in each of the hole injecting layer 262a, the hole transporting layer 262b, the organic light-emitting layer 262c, the electron transporting layer 262d, and the electron injecting layer 262e. Because the transparent electrode 261c is provided in the convex lens form, a wavefront of light LW may also travel in a convex form as illustrated in FIG. 10. That is, the transparent electrode 261c may act as a convex lens.

Therefore, in an example embodiment of the present disclosure, due to the transparent electrode 261c having the convex lens form, a hemispherical resonance structure may be provided between the first electrode 261 and the second electrode 262 as in the FIG. 10 example. The hemispherical resonance structure may be a resonance structure using a plane and a hemispherical surface, and is known as a stable resonance structure. In the example of FIG. 9, the reflective electrode 261a of the first electrode 261 may correspond to the plane, and the hemispherical surface may correspond to the second electrode 263. As a result, in an example embodiment of the present disclosure, light may stably resonate in the second area NPA. Thus, light may concentrate on the second area NPA.

Moreover, the light-emitting layer 262 may include a first insulation layer 269 disposed in a first area IPA1. Due to the first insulation layer 269, a current flowing between the first electrode 261 and the second electrode 263 may be blocked. Therefore, the current flowing between the first electrode 261 and the second electrode 263 may primarily flow to the second area NPA in which the first low refractive layer 264 may not be provided. That is, holes and electrons may be recombined in the organic light-emitting layer in the second area NPA to generate excitons. Thus, a distribution of the excitons may be increased or maximized in the second area NPA.

As described above, in an example embodiment of the present disclosure, light may concentrate on the second area NPA, and moreover, the distribution of the excitons may be increased or maximized in the second area NPA, thereby increasing an emission efficiency of the organic light-emitting device 260.

The first insulation layer 269 may be formed at an arbitrary position between the first electrode 261 and the second electrode 262. In FIG. 9, the first insulation layer 269 is illustrated as being disposed between the hole transporting layer 262b and the organic light-emitting layer 262c, but embodiments are not limited thereto. For example, the first insulation layer 269 may be disposed between the organic light-emitting layer 262c and the electron transporting layer 262d, between the electron transporting layer 262d and the electron injecting layer 262e, between the electron injecting layer 262e and the second electrode 263, between the hole injecting layer 262a and the hole transporting layer 262b, or between the first electrode 261 and the hole injecting layer 262a. However, in an example embodiment of the present disclosure, to realize a structure in which light concentrates on the second area NPA and a distribution of excitons is maximized, the first insulation layer 269 may be disposed adjacent to the organic light-emitting layer 262c.

FIG. 10 is an enlarged view illustrating another example of area B of FIG. 8.

Except for a first electrode 261 including a first transparent electrode 261c and a second transparent electrode 216d, and a distributed Bragg reflector 266 being provided under the first electrode 261, an example embodiment illustrated in FIG. 10 is substantially similar to the example embodiment described above with reference to FIG. 9. Thus, detailed descriptions of a light-emitting layer 262, a second electrode 263, and a first insulation layer 269 of FIG. 10 are omitted for convenience.

With reference to the FIG. 10 example, the first electrode 261 may include the first transparent electrode 261c and the second transparent electrode 216d under the first transparent electrode 261c. The first transparent electrode 261c may be provided in a convex lens form in each of second areas NPA. The second transparent electrode 216d may be provided in a whole portion of a pixel P. The first transparent electrode 261c and the second transparent electrode 216d may each be formed of a transparent conductive material (TCO), such as ITO or IZO, capable of transmitting light, e.g., to transfer light, reflected from the distributed Bragg reflector 266, to the light-emitting layer 262.

Moreover, the transparent electrode 261c may be provided in the convex lens form in each of the second areas NPA. Thus, a hole injecting layer 262a, a hole transporting layer 262b, an organic light-emitting layer 262c, an electron transporting layer 262d, an electron injecting layer 262e, and a second electrode 263 may be convexly provided in each of the second areas NPA.

The distributed Bragg reflector 266 may be formed by alternately stacking a plurality of inorganic layers having different refractive indexes. The term "distributed Bragg reflector" may denote a reflective structure in which constructive interference is performed on lights reflected from boundary surfaces between the inorganic layers having different refractive indexes to reflect light having a particular wavelength. For example, as in the FIG. 10 example, the distributed Bragg reflector 266 may have a structure in which a first inorganic layer 266a and a second inorganic layer 266b having a refractive index lower than that of the first inorganic layer 266a may be alternately stacked. For example, the first inorganic layer 266a may be $SiO_x$, and the second inorganic layer 266b may be $SiN_x$. However, embodiments are not limited thereto.

A refractive index of the first transparent electrode 261c may be higher than that of each of the hole injecting layer 262a, the hole transporting layer 262b, the organic light-emitting layer 262c, the electron transporting layer 262d, and the electron injecting layer 262e of the light-emitting layer 262. Therefore, light in the first transparent electrode 261c may travel faster than light in each of the hole injecting layer 262a, the hole transporting layer 262b, the organic light-emitting layer 262c, the electron transporting layer 262d, and the electron injecting layer 262e. Because the first transparent electrode 261c may be provided in the convex lens form, a wavefront of light LW may also travel in a convex form as in the example of FIG. 10. That is, the first transparent electrode 261c may act as a convex lens.

Therefore, in an example embodiment of the present disclosure, due to the first transparent electrode 261c having the convex lens form, a hemispherical resonance structure may be provided between the first electrode 261 and the second electrode 262, as illustrated in FIG. 10. The hemispherical resonance structure may be a resonance structure using a plane and a hemispherical surface, and is known as a stable resonance structure. In the FIG. 10 example, the distributed Bragg reflector 266 may correspond to the plane, and the hemispherical surface may correspond to the second electrode 263. As a result, in an example embodiment of the present disclosure, light may stably resonate in the second area NPA. Thus, light may concentrate on the second area NPA.

Moreover, the light-emitting layer 262 may include a first insulation layer 269 disposed in a first area IPA1. Due to the first insulation layer 269, a current flowing between the first electrode 261 and the second electrode 263 may be blocked. Therefore, the current flowing between the first electrode 261 and the second electrode 263 may primarily flow to the second area NPA in which the first low refractive layer 264 may not be provided. That is, holes and electrons may be recombined in the organic light-emitting layer in the second area NPA to generate excitons. Thus, a distribution of the excitons may be increased or maximized in the second area NPA.

As described above, in an example embodiment of the present disclosure, light may concentrate on the second area NPA, and moreover, the distribution of the excitons may be increased or maximized in the second area NPA, thereby increasing an emission efficiency of the organic light-emitting device 260.

Figure 11:
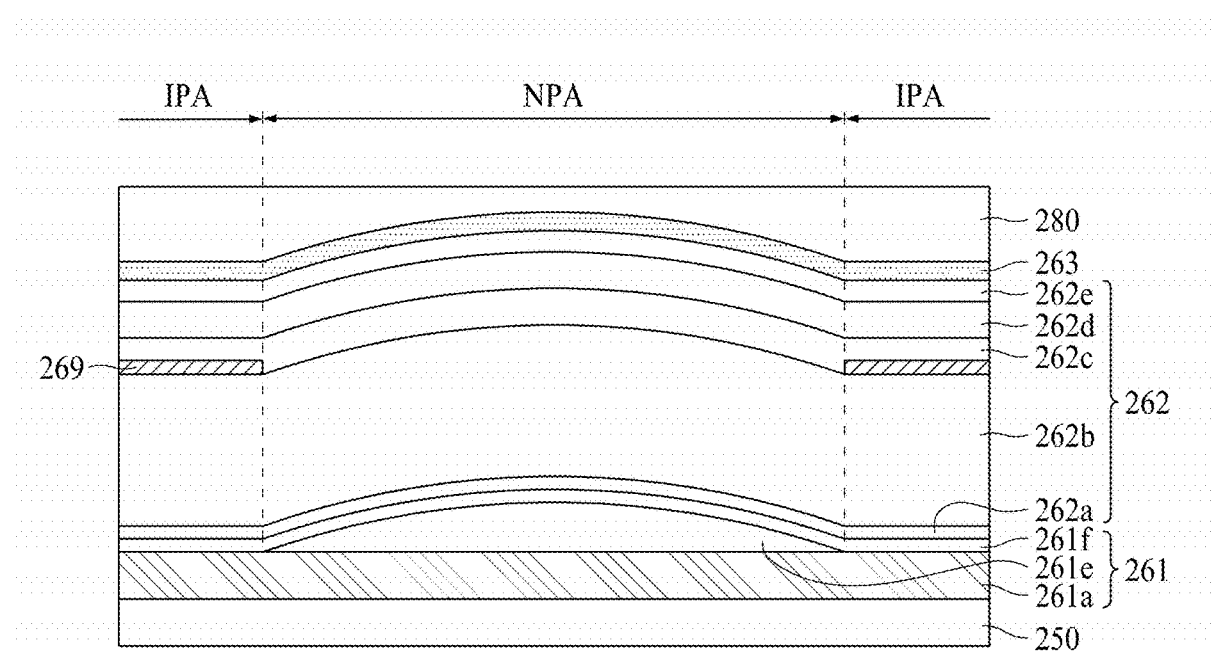
FIG. 11 is an enlarged view illustrating another example of area B of FIG. 8.

FIG. 11 is an enlarged view illustrating another example of area B of FIG. 8.

Except for a first electrode 261 including a reflective electrode 261a, a dielectric layer 261e, and a transparent electrode 261f, an example embodiment illustrated in FIG. 11 is substantially similar to the example embodiment described above with reference to FIG. 9. Thus, detailed descriptions of a light-emitting layer 262, a second electrode 263, and a first insulation layer 269 of FIG. 11 are omitted for convenience.

With reference to the FIG. 11 example, an organic light-emitting display device according to an embodiment of the present disclosure may be implemented in a top-emission type in which light of the light-emitting layer 262 of an organic light-emitting device 260 may be irradiated in a direction toward the second substrate 112. Thus, the first electrode 261 may include the reflective electrode 261a. The reflective electrode 261a may be formed of a metal material, which is high in reflectivity, such as Al, Ag, an Al alloy, an Ag alloy, or an APC alloy. The dielectric layer 261e having a convex lens form may be provided on the reflective electrode 261a, and may be formed of $SiN_x$, $TiO_2$, and/or the like. The transparent electrode 261f may be provided on the reflective electrode 261a and the dielectric layer 261e having the convex lens form.

The reflective electrode 261a and the transparent electrode 261f may be provided in a whole portion of each of pixels RP, GP, and BP. The dielectric layer 261e having the convex lens form may be provided in each of second areas NPA of each of the pixels RP, GP, and BP.

Moreover, the dielectric layer 261e may be provided in the convex lens form in each of the second areas NPA. Thus, a hole injecting layer 262a, a hole transporting layer 262b, an organic light-emitting layer 262c, an electron transporting layer 262d, an electron injecting layer 262e, and a second electrode 263 may be convexly provided in each of the second areas NPA.

Therefore, in an example embodiment of the present disclosure, due to the dielectric layer 261e having the convex lens form, a hemispherical resonance structure may be provided between the first electrode 261 and the second electrode 262 as in the example of FIG. 10. The hemispherical resonance structure may be a resonance structure using a plane and a hemispherical surface, and is known as a stable resonance structure. In the FIG. 11 example, the reflective electrode 261a of the first electrode 261 may correspond to the plane, and the hemispherical surface may correspond to the second electrode 263. As a result, in an example embodiment of the present disclosure, light may stably resonate in the second area NPA. Thus, light may concentrate on the second area NPA.

Moreover, in the example of FIG. 11, a distributed Bragg reflector may be provided instead of the reflective electrode 261a.

Figure 12:
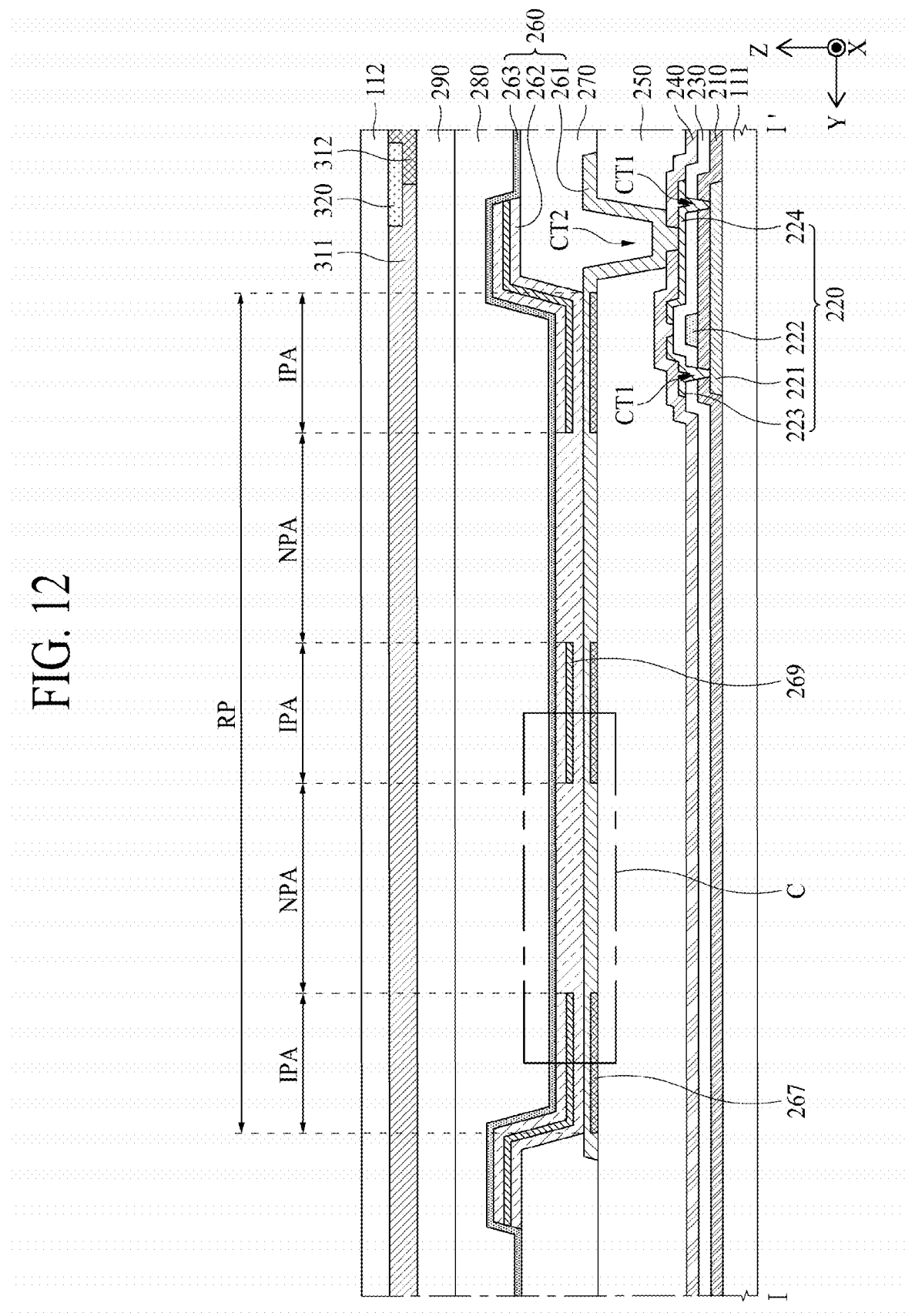
FIG. 12 is a cross-sectional view illustrating another example taken along line I-I' of FIG. 4.

FIG. 12 is a cross-sectional view illustrating another example taken along line I-I' of FIG. 4.

Except for a first electrode 261 being formed of a transparent electrode, a distributed Bragg reflector 266 being provided under the first electrode 261, and a second low refractive layer 267 being provided between the distributed Bragg reflector 266 and the first electrode 261 in a first area IPA, an example embodiment illustrated in FIG. 12 is substantially similar to the example embodiment described above with reference to FIG. 5. Thus, detailed descriptions of a first substrate 111, a second substrate 112, a gate insulation layer 210, a transistor 220, an interlayer dielectric 230, a passivation layer 240, a planarization layer 250, a first electrode 261, a light-emitting layer 262, a second electrode 263, a bank 270, an encapsulation layer 280, an adhesive layer 290, color filters 311 and 312, and a black matrix 320 of FIG. 12 are omitted for convenience. The distributed Bragg reflector 266 disposed under the first electrode 261 and the second low refractive layer 267 disposed between the distributed Bragg reflector 266 and the first electrode 261 in the first area IPA will be described below in detail with reference to the examples of FIGS. 13 and 14.

Figure 13:
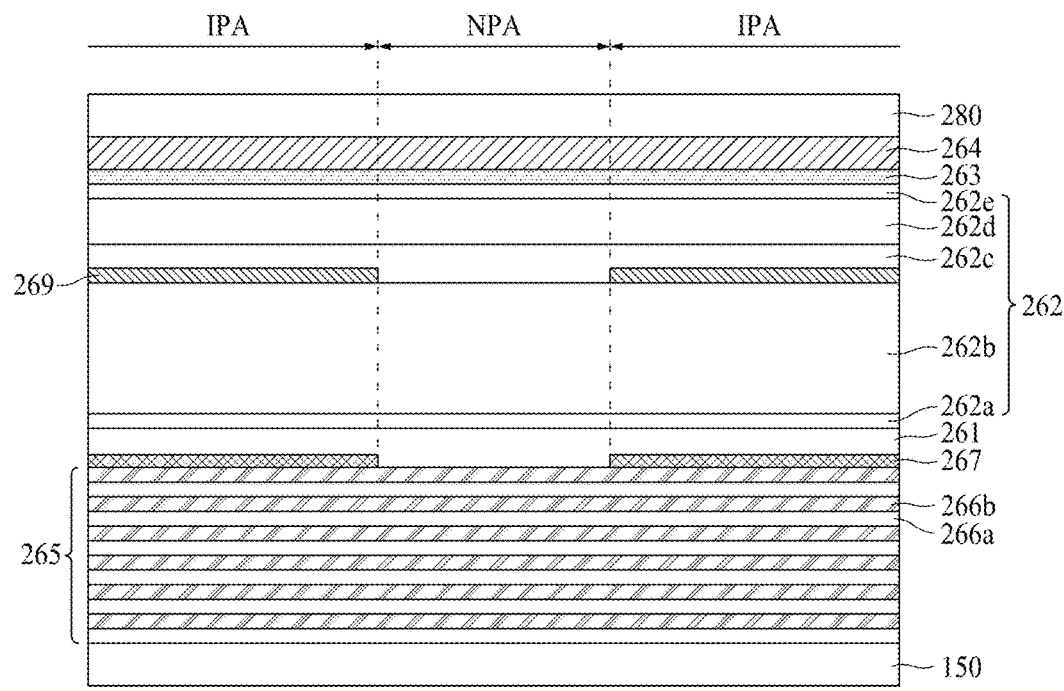
FIG. 13 is an enlarged view illustrating an example of area C of FIG. 12.

FIG. 13 is an enlarged view illustrating an example of area C of FIG. 12.

Except for a first electrode 261 being formed of a transparent electrode, a distributed Bragg reflector 266 being provided under the first electrode 261, and a second low refractive layer 267 being provided between the distributed Bragg reflector 266 and the first electrode 261 in a first area IPA, an example embodiment illustrated in FIG. 13 is substantially similar to the example embodiment described above with reference to FIG. 6. Thus, detailed descriptions of a first electrode 261, a light-emitting layer 262, a second electrode 263, a capping layer 264, and a first low refractive layer 264 of FIG. 13 are omitted for convenience.

With reference to the FIG. 13 example, the distributed Bragg reflector 266 may be formed by alternately stacking a plurality of inorganic layers having different refractive indexes. The term "distributed Bragg reflector" may denote a reflective structure in which constructive interference is performed on lights reflected from boundary surfaces between the inorganic layers having different refractive indexes to reflect light having a particular wavelength. For example, as in the FIG. 10 example, the distributed Bragg reflector 266 may have a structure in which a first inorganic layer 266a and a second inorganic layer 266b having a refractive index lower than that of the first inorganic layer 266a may be alternately stacked. For example, the first inorganic layer 266a may be $SiO_x$, and the second inorganic layer 266b may be $SiN_x$. However, embodiments are not limited thereto.

The second low refractive layer 267 may be provided between the distributed Bragg reflector 266 and the first electrode 261 in the first area IPA. A refractive index of the second low refractive index 267 may be lower than that of each of the first electrode 261, a hole injecting layer 262a, a hole transporting layer 262b, an organic light-emitting layer 262c, an electron transporting layer 262d, an electron injecting layer 262e, and the distributed Bragg reflector 266. For example, if the second low refractive layer 267 is disposed between the distributed Bragg reflector 266 and the first electrode 261, light traveling from each of the distributed Bragg reflector 266 and the first electrode 261 to the second low refractive layer 267 may be refracted due to a refractive index difference between the second low refractive layer 267 and each of the distributed Bragg reflector 266 and the first electrode 261 as in the example of FIG. 6. That is, the second low refractive layer 267 may act as the convex lens of FIG. 6, and thus, may allow light to concentrate on the second area NPA. Also, although the first electrode 261 and the second electrode 263 may be planarly provided, the light may stably resonate in the second area NPA due to the second low refractive layer 267. The second low refractive layer 267 may be formed, for example, of acryl copolymer, siloxane polymer, polyimide, and/or the like.

As described above, in an example embodiment of the present disclosure, because the second low refractive layer 267 may be provided between the distributed Bragg reflector 266 and the first electrode 261 in the first area IPA, light may concentrate on the second area NPA. Accordingly, in an example embodiment of the present disclosure, an emission efficiency of the organic light-emitting device 260 may increase.

Moreover, to increase an effect in which light is refracted like a convex lens, an edge of the second low refractive layer 267 may be provided to have a particular slope. For example, the edge of the second low refractive layer 267 may be provided in a taper structure as in the example of FIG. 13. In FIG. 13, the edge of the second low refractive layer 267 is illustrated as being provided in the taper structure, but embodiments are not limited thereto. For example, the edge of the second low refractive layer 267 may be provided in a reverse taper structure. The term "taper structure" may denote a structure in which an angle between a bottom and a side is 0° (degrees) to 90° (degrees). The term "reverse taper structure" may denote a structure in which the angle between the bottom and the side is 90° (degrees) to 180° (degrees).

Figure 14:
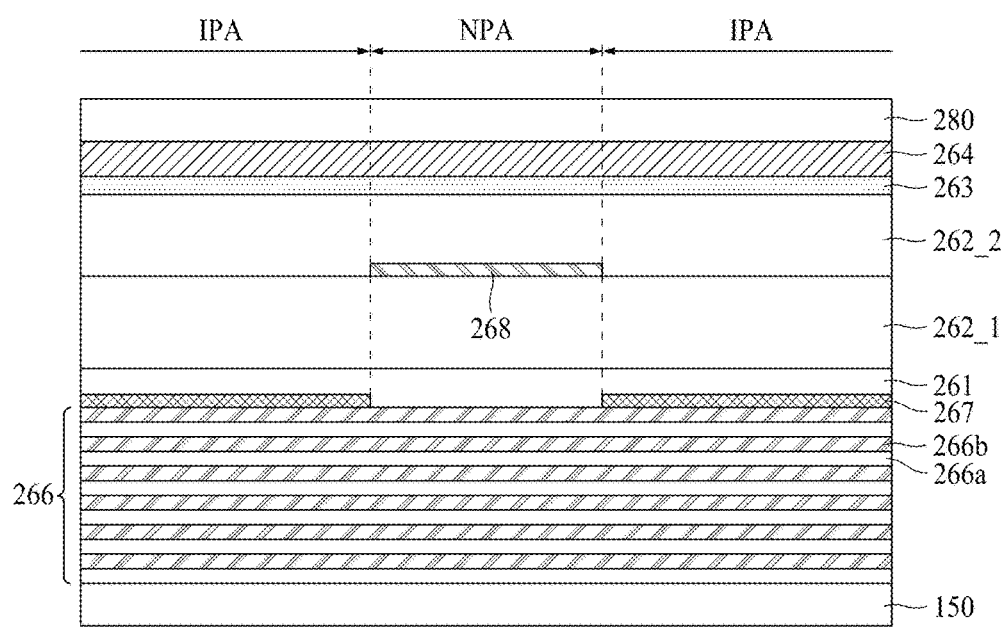
FIG. 14 is an enlarged view illustrating another example of area C of FIG. 12.

FIG. 14 is an enlarged view illustrating another example of area C of FIG. 12.

Except for a light-emitting layer 262 including a first light-emitting layer 262_1, a second light-emitting layer 262_2, and a charge generating layer 268, an example embodiment illustrated in FIG. 14 is substantially similar to the example embodiment described above with reference to FIG. 13. Thus, detailed descriptions of a first electrode 261, a second electrode 263, a capping layer 264, a distributed Bragg reflector 266, and a second low refractive layer 267 of FIG. 14 are omitted for convenience.

Moreover, in FIG. 14, it is illustrated that a first low refractive layer 264 is omitted, but embodiments are not limited thereto. That is, the first low refractive layer 264 may be included in the first light-emitting layer 262_1 and the second light-emitting layer 262_2.

With reference to the FIG. 14 example, the first light-emitting layer 262_1 and the second light-emitting layer 262_2 may each include a hole injecting layer, a hole transporting layer, at least one organic light-emitting layer, an electron transporting layer, and an electron injecting layer. For example, the light-emitting layer 262 may be a common layer that may be formed in the pixels RP, GP, and BP in common, and may be a white light-emitting layer that may emit white light.

The charge generating layer 268 may be provided between a first-stack light-emitting layer 262_1 and a second-stack light-emitting layer 262_2 in a second area NPA. Therefore, a current flowing between the first electrode 261 and the second electrode 263 may concentrate on and flow to the second area NPA in which the charge generating layer 268 is provided. That is, holes and electrons may be recombined in an organic light-emitting layer in the second area NPA to generate excitons. Accordingly, a distribution of the excitons is maximized in the second area NPA.

As described above, according to an embodiment of the present disclosure, in a plurality of stack structures including two or more light-emitting layers, because the charge generating layer 268 may be provided in the second area NPA, the distribution of the excitons may be increased or maximized in the second area NPA, thereby increasing an emission efficiency of the organic light-emitting device 260.

As described above, according to embodiments of the present disclosure, the insulation layer having a refractive index lower than that of the light-emitting layer may be provided in the first area. Therefore, according to embodiments of the present disclosure, light traveling from the light-emitting layer to the insulation layer may be refracted by the insulation layer. That is, the insulation layer may act as a convex lens. Therefore, according to embodiments of the present disclosure, although the first electrode and the second electrode may be planarly provided, light may stably resonate in the second area defined by the first area. Also, according to embodiments of the present disclosure, a current flowing between the first electrode and the second electrode may be blocked by the insulation layer. Therefore, according to embodiments of the present disclosure, the current flowing between the first electrode and the second electrode may primarily flow to the second area in which the insulation layer may not be provided. Therefore, according to embodiments of the present disclosure, holes and electrons may be recombined in the organic light-emitting layer in the second area to generate excitons. Thus, a distribution of the excitons may be increased or maximized in the second area. As described above, according to embodiments of the present disclosure, light may stably resonate in the second area, and moreover, the distribution of the excitons may be increased or maximized in the second area, thereby increasing an emission efficiency of the organic light-emitting device.

Moreover, according to embodiments of the present disclosure, in a plurality of stack structures including two or more light-emitting layers, the charge generating layer may be provided in the second area. Thus, the distribution of the excitons may be increased or maximized in the second area, thereby increasing the emission efficiency of the organic light-emitting device.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. An organic light-emitting display device, comprising:
a first substrate;
a first electrode on the first substrate;
a light-emitting layer on the first electrode; and
a second electrode on the light-emitting layer,
wherein an area in which the first electrode, the light-emitting layer, and the second electrode are sequentially stacked is defined as a pixel,
wherein the light-emitting layer comprises a low refractive layer disposed in a first area in the pixel, and not in a second area in the pixel,
wherein the light-emitting layer comprises:
a hole transporting layer on the first electrode,
an organic light-emitting layer on the hole transporting layer, and
an electron transporting layer on the organic light-emitting layer,
wherein the low refractive layer is directly between the hole transporting layer and a portion of the organic light-emitting layer, and
wherein a refractive index of the low refractive layer is lower than a refractive index of the organic light-emitting layer.

2. The organic light-emitting display device of claim 1, wherein the refractive index of the low refractive layer is lower than a respective refractive index of each of: the hole transporting layer, and the electron transporting layer.

3. The organic light-emitting display device of claim 1, wherein the first electrode comprises:

a reflective electrode configured to reflect light; and
a transparent electrode on the reflective electrode.

4. The organic light-emitting display device of claim 1, further comprising:
a distributed Bragg reflector under the first electrode,
wherein the first electrode comprises a transparent electrode.

5. An organic light-emitting display device, comprising:
a first substrate;
a first electrode on the first substrate;
a light-emitting layer on the first electrode; and
a second electrode on the light-emitting layer,
wherein an area in which the first electrode, the light-emitting layer, and the second electrode are sequentially stacked is defined as a pixel,
wherein the light-emitting layer comprises a low refractive layer disposed in a first area in the pixel, and not in a second area in the pixel,
wherein the first electrode comprises a first transparent electrode disposed in the second area in the pixel,
wherein the light-emitting layer comprises:
a hole transporting layer on the first electrode,
an organic light-emitting layer on the hole transporting layer, and
an electron transporting layer on the organic light-emitting layer,
wherein the low refractive layer is directly between the hole transporting layer and a portion of the organic light-emitting layer, and
wherein a refractive index of the low refractive layer is lower than a refractive index of the organic light-emitting layer.

6. The organic light-emitting display device of claim 5, wherein the first transparent electrode has a convex lens form.

7. The organic light-emitting display device of claim 6, wherein the first electrode further comprises a reflective electrode under the first transparent electrode.

8. The organic light-emitting display device of claim 6, further comprising:
a distributed Bragg reflector under the first electrode,
wherein the first electrode further comprises a second transparent electrode under the first transparent electrode.

9. The organic light-emitting display device of claim 5, wherein a refractive index of the first transparent electrode is higher than the refractive index of the organic light-emitting layer and a respective refractive index of each of: the hole transporting layer, and the electron transporting layer.

10. The organic light-emitting display device of claim 5, wherein the first electrode further comprises:
a dielectric layer disposed under the first transparent electrode to have a convex lens form in the second area in the pixel; and
a reflective electrode disposed under the dielectric layer.

11. The organic light-emitting display device of claim 5, further comprising a second low refractive layer disposed between a distributed Bragg reflector and the first electrode.

12. The organic light-emitting display device of claim 5, wherein the refractive index of the low refractive layer is lower than a respective refractive index of each of: the hole transporting layer, and the electron transporting layer.

* * * * *